United States Patent [19]

Cederbaum et al.

[11] Patent Number: 5,319,262

[45] Date of Patent: Jun. 7, 1994

[54] LOW POWER TTL/CMOS RECEIVER CIRCUIT

[75] Inventors: Carl Cederbaum, Versailles; Philippe Girard, Corbeil-Essonnes, both of France

[73] Assignee: International Business Machines Corporation, Armonk, N.Y.

[21] Appl. No.: 15,193

[22] Filed: Feb. 10, 1993

[30] Foreign Application Priority Data

Feb. 26, 1992 [EP] European Pat. Off. ........ 92480029.5

[51] Int. Cl.⁵ ............. H03K 19/0185; H03K 19/0948
[52] U.S. Cl. .................................. 307/475; 307/451;
307/443
[58] Field of Search ............... 307/475, 451, 443, 290,
307/527

[56] References Cited

U.S. PATENT DOCUMENTS

| | | | |
|---|---|---|---|
| 4,656,373 | 4/1987 | Plus | 307/451 |
| 4,672,243 | 6/1987 | Kirsch | 307/475 |
| 4,929,852 | 5/1990 | Bae | 307/475 |
| 5,021,684 | 6/1991 | Ahuja et al. | 307/443 |

FOREIGN PATENT DOCUMENTS 0386570A  9/1990  European Pat. Off. .............. H03K 19/0185
2197558A  5/1988  United Kingdom ...... H03K 19/092

OTHER PUBLICATIONS

IBM Technical Disclosure Bulletin, vol. 32, No. 12, May 1990, pp. 411–413, "High Performance CMOS Receiver Circuit For Interfacing With TTL, ECL, NMOS or CMOS Logic Circuits".

Primary Examiner—Edward P. Westin
Assistant Examiner—Jon Santamauro
Attorney, Agent, or Firm—H. Daniel Schnurmann

[57] ABSTRACT

A low power TTL/CMOS receiver circuit consists of four stages, each of which is, respectively, comprised of at least two complementary FET devices connected to each other in series. The various stages control each other by a variety of feedback interconnections. The use of feedback loops permits to significantly decrease the DC current in the input stage of the receiver circuit. It also realizes a substantial decrease in AC current consumption, although less significantly. Finally, delay variations between input and output signals are obtained as well as substantial improvements in the symmetry between the true and complement output signals of the receiver circuit.

6 Claims, 2 Drawing Sheets

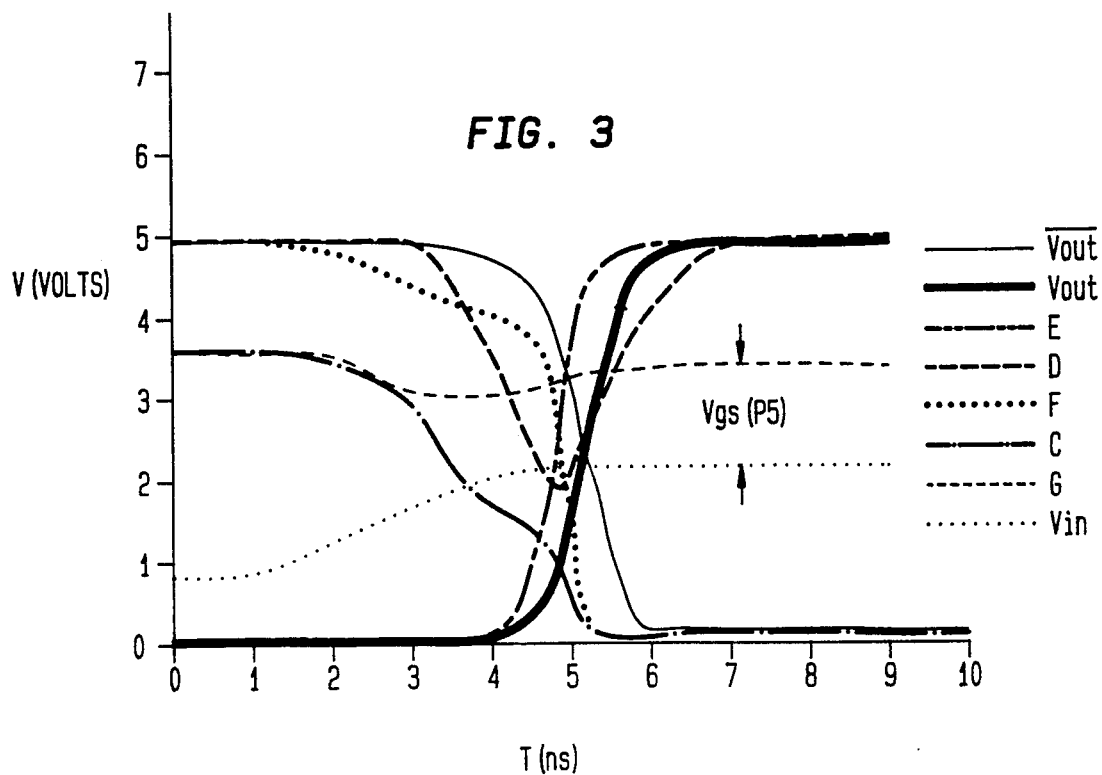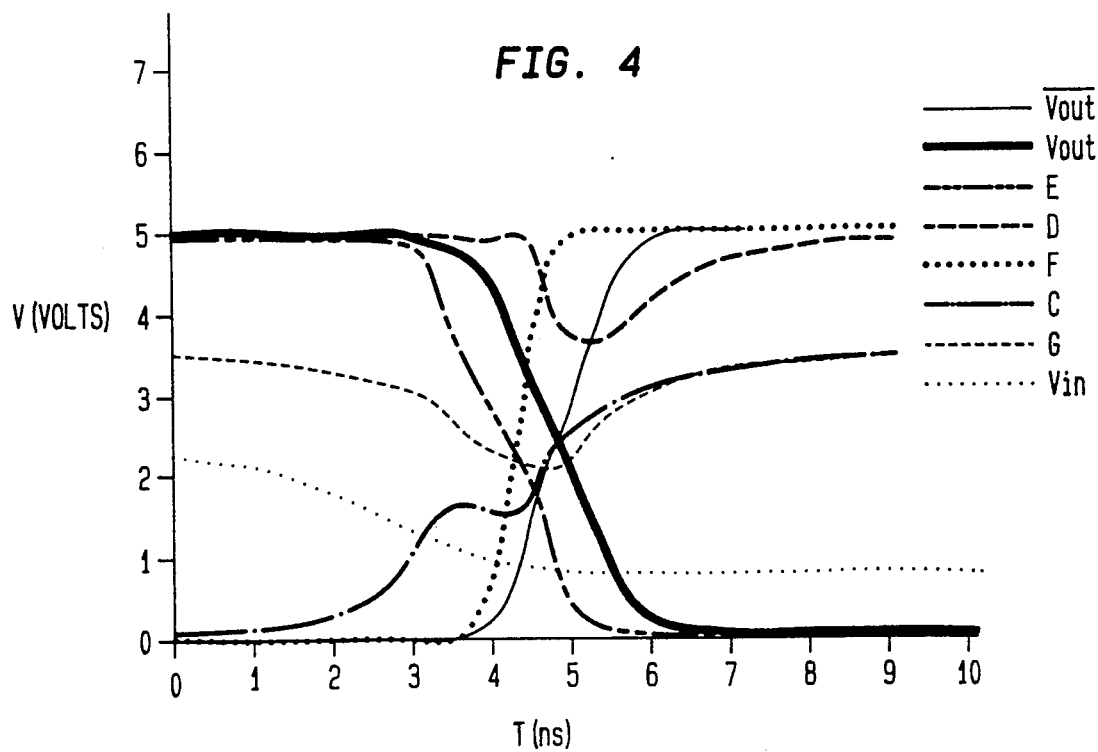

# LOW POWER TTL/CMOS RECEIVER CIRCUIT

FIELD OF THE INVENTION

The present invention relates to a CMOS logic circuits and more particularly to a low power TTL/CMOS receiver circuit.

BACKGROUND OF THE INVENTION

TTL components are extensively used in standard electronic boards while CMOS technology has found wide acceptance in the implementation of complex logic/memory functions of semiconductor chips. A major concern in the high and low voltage levels in TTL circuits which are different from those in CMOS circuits. By way of example, a typical TTL circuit operates with standard high and low voltages of approximately 2.2 and 0.8 volts, respectively, while typical CMOS circuits operate with high and low voltages of 5 and 0 volts, respectively. As a result, in order to couple the output of a TTL circuit to the input of a CMOS circuit, a converting circuit is commonly used to change the logic levels. Conversion from TTL levels to CMOS levels is conventionally realized with CMOS on-chip receivers. These CMOS receiver circuits suffer from a high DC current flowing in the input branch when the input TTL signal is at a high level, as will be illustrated in conjunction with the conventional TTL/CMOS receiver circuit 10 shown in FIG. 1.

As apparent from FIG. 1, the first stage consists of an inverter I0 that amplifies the logic input signal $V_{in}$ at the input terminal 11. The amplified signal is latched in latch 12 which includes two inverters I1 and I2 connected in series, and whose respective inputs and outputs are interconnected. Complementary signal phases are generated and enforces at full-swing levels on nodes A and B. Finally, buffered true and complement output signals $V_{out}$ and $V_{\overline{out}}$, are delivered via inverting buffers I3 and I4 at the output terminals 13 and 14, respectively. Inverters and buffers are conventionally comprised of a pair of complementary FET devices as illustrated in FIG. 1. These circuits are biased between a first supply voltage $V_H$, typically, 5 volts, and a second supply voltage, typically ground (GND).

The main drawback of this conventional solution occurs when the input signal $V'_{in}$ is at its TTL high level, i.e., approximately 2.2 Volts, which is not sufficient to completely turn off PFET P'0 of inverter I0 when NFET N'0 is saturated. In this instance, the gate to source voltage $V_{gs}(P'0)$ is approximately 2.8 V. As a result, a few milliamps of DC current are produced in the quiescent state as they flow through the two FET devices.

In addition, the conventional circuit of FIG. 1 is recognized to exhibit large delay variations (or dispersions) between the input and output signals which, in turn, results in a distinct level of asymmetry between the signals representing the two phases of the output signal for both rising and fall transitions of the input signal.

OBJECTS AND SUMMARY OF THE INVENTION

Therefore, it is a primary object of the present invention to provide a low power TTL/CMOS receiver circuit that consumes substantially no DC current in its steady state.

It is another object of the present invention to provide a low power TTL/CMOS receiver circuit that displays minimal delay variations between input and output signals.

According to the basic principle of the present invention, the TTL/CMOS receiver circuit disclosed herein, uses feedback loops to disclose the DC current flowing in the input stage of the receiver circuit when the input signal is at a high level. Additionally, it also improves the AC current consumption albeit less significantly. Finally, it reduces delay variations between the input and the output signals, thereby improving the symmetry between the true and complement phases of the output signal.

The TTL/CMOS receiver circuit according with the present invention is biased between the first and second power supply voltages. It includes an input or first stage comprised of a standard inverter formed by two complementary FET devices with an intermediate NFET coupled in between, thus defining a first and second common nodes. The second stage is formed by an NFET and a PFET connected in series with a third common output node coupled in between, and whose gate electrodes are driven by the potentials at the first and second common nodes, respectively. The third common node is connected to the gate electrode of a pull-up PFET mounted in series with a pull-up down NFET, thereby defining a fourth common node in between which is connected to the gate electrode of the intermediate NFET in the input stage by a first feedback loop connection. The gate of the pull-down NFET is connected to the common gate of the inverter of the first stage. A feedback PFET device is connected between the third common node and the first supply voltage, whose gate electrode is, in turn, connected to the fourth common node. The pull-up, pull-down and feedback FET devices comprise the third stage.

The receiver circuit further includes a pull-up circuit comprised of two active complementary FET devices connected in series and defining a fifth common node coupled in between. The active NFET is loaded by a PFET which is resistively connected. Its gate electrode is attached to the third common node via a second feedback loop. On the other hand, the active PFET device has its drain region connected to the first common node. These three FET devices comprise the fourth stage of the TTL/CMOS receiver circuit. The input signal received at the input terminal is applied both to the gate electrode of the above mentioned active PFET and to the common gate electrode of the inverter of the first stage.

Finally, an inverting buffer is preferably connected to each of the third and fourth common nodes to deliver the buffered true and complement output signals at the respective output terminals.

BRIEF DESCRIPTION OF THE DRAWINGS

The novel features believed to be characteristic of this invention are set forth in the appended claims. The invention itself, however, as well as other objects and advantages thereof, may best be understood by reference to the following detailed description of an illustrated preferred embodiment to be read in conjunction with the accompanying drawings, in which:

FIG. 3 illustrates the signal waveforms at various node/terminals of the novel TTL/CMOS receiver circuit for an input rising transition of the TTL input signal; and FIG. 4 illustrates signal waveforms at various node/terminals of the TTL/CMOS receiver circuit for a falling transition of the TTL input signal.

DESCRIPTION OF THE INVENTION

Figure 2:
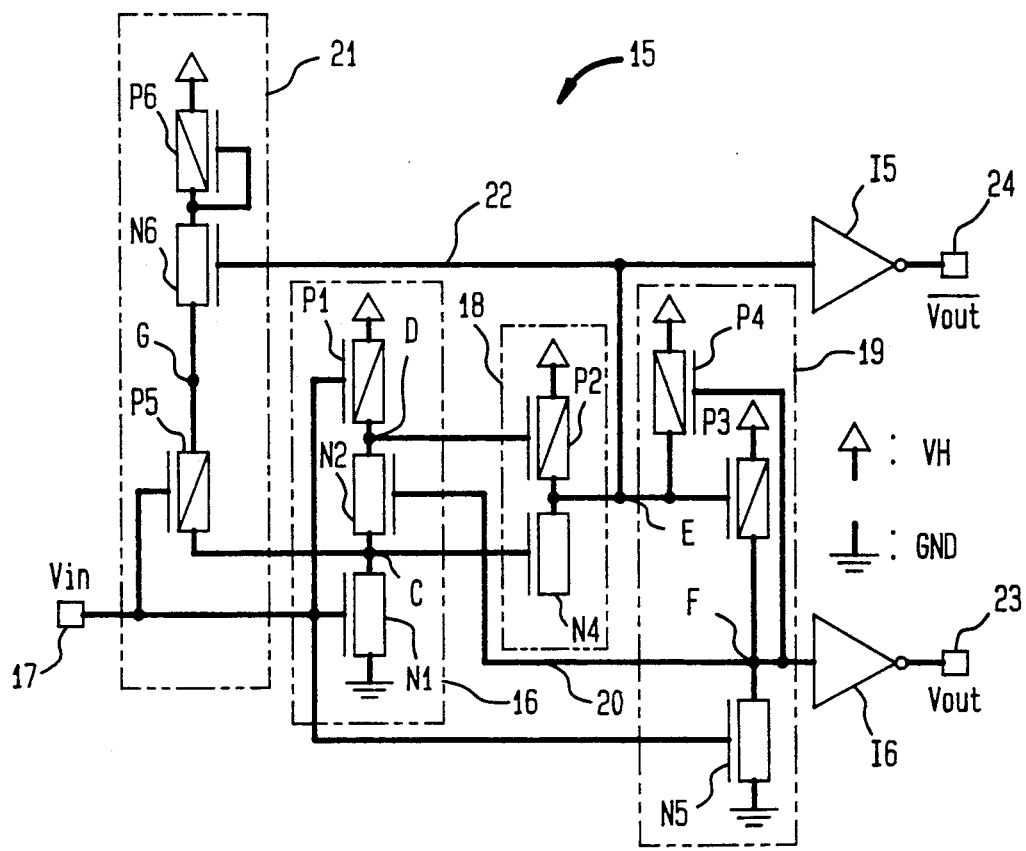
FIG. 2 shows the TTL/CMOS receiver circuit in accordance with the present invention which generates true and complement CMOS output signals from an input signal at TTL levels.

A schematic of the TTL/CMOS receiver circuit according to the present invention is shown in FIG. 2 and bears reference numeral 15. The receiver circuit is biased between first and second supply voltages, respectively, $V_H$ and GND. The input stage 16 is comprised of three FET devices: P1, N1, and N2. FET devices P1 and N1 form an inverter with the NFET N2 coupled in between, and which defines two common nodes C and D. The input signal $V_{in}$ received at the input terminal 17 is applied to the common gate electrode of the inverter. A second stage 18, made of two FET devices P2 and N4, is connected in series with common node E coupled in between. Gate electrodes of FET devices N4 and P2 are connected to the nodes C and D, respectively. A third stage 19 is comprised of FET devices P3, P4 and N5. Pull-up and pull-down FET devices P3 and N5 are connected in series with common node F coupled in between. The voltage at node F controls NFET N2 via a first feedback loop connection 20, while the gate electrode of NFET N5 is connected to input terminal 17. A feedback PFET P4 is attached to node E and has its gate electrode tied to node F. Receiver circuit 15 further comprises a pull-up circuit 21 forming a fourth stage consisting of FET devices P5, P6 and N6 connected to each other in series. NFET N6 is loaded by resistively-mounted PFET P6, having its gate electrode driven by the voltage at node E, via a second feedback connection 22. The common node between FET devices N6 and P5 is referenced G.

The signals generated at nodes E and F drive two conventional CMOS inverters I5 and I6 that deliver the buffered true and complement phases $V_{out}$ and $V_{\overline{out}}$ at the output terminals 23 and 24. In the quiescent state, the operation of the TTL/CMOS receiver in accordance with the present invention, as illustrated in FIG. 2, reads as follows:

When input signal $V_{in}$ is low, NFETs N1 and N5 are cut off, while PFETs P1 and P5 are turned on. The potential at node F is at a high level since NFET N5 is cut-off, which switches NFET N2 on via the feedback loop 20, thus rendering NFET N4 conductive. As a result, the potential at node E is low. A low potential at node E cuts-off NFET N6 via feedback loop 22. Therefore, the voltage on node C is equal to the voltage on node D, i.e., it is high since it equals $V_H$ (PFET P1 is on) minus a $V_T$ drop through NFET N2. The voltage of node G equals to the voltage at node C since PFET P5 is conducting. The potential of node D cuts off PFET P2 while NFET N4 clamps node E to GND. This implies that NFET N6 is turned off and PFET P3 turned on, leading to a high potential on node F, as was previously mentioned.

NFETs N1 and N5 switch on when input signal $V_{in}$ is high. As a result, nodes C and F drop to GND. This implies that PFET P4 turns on, and holds node E to the high level $V_H$. NFET N6, is turned on via feedback loop 22 and NFET N2 off, via feedback loop 20. Therefore, the inverter in input stage 16 leaves nodes C and D open circuited. Node D is held at $V_H$ through PFET P1 which is conducting since the input signal $V_{in}$ is not sufficiently high to turn it off completely. In the fourth stage 21, each FET device is conductive, but PFET P5 has only a low $V_{gs}$ equal to $V_H$ minus the voltage at node G, thus limiting DC current in the input stage 16.

Dynamic operation of circuit 15 of FIG. 2 will be better understood in conjunction with the waveform illustrated in FIGS. 3 and 4, which show the potential/signals at various internal nodes/terminals for a rising and a falling transition of the input signal $V_{in}$, respectively.

Referring to FIG. 3, when an input signal rising transition occurs, NFET N1 switches on, which in turn discharges nodes C and D through NFET N2. The potential on node F slowly decreases since PFET P3 is on. When the potentials of nodes C and D are sufficiently low, the potential at node E rises and turns NFET N6 on. The signal at node G that started falling slowly through PFET P5 and NFET N1 is now held to around 3.5 volts through PFET P6 and NFET N6. When the input signal is high, it results in a low $V_{gs}$ voltage at PFET P5, thereby reducing the current in NFET N1 of the first stage as previously explained. When the voltage at node E potential reaches $V_H$ minus $V_T(P3)$, it turns PFET P3 in the third stage off, thereby accelerating the voltage fall at node F through NFET N5, and cutting off NFET N2 in the input stage. As a result, the voltage at node D stops falling and returns to $V_H$ through PFET P1. At the end of the rising transition, FET devices P2 and N4 are off, and PFET P4 on, thus ensuring a high level at node E. At the end of the rising transition, the potential of nodes C and F is low whereas the voltage at nodes D and E remain at a high. It may be noticed that the PFET P5 is biased between $V_H$ at 1.5 V and node C at GND. As a result, $V_{gs}(P5)=1.3$ V, which is compared to $V_{gs}(P'0)=2.8$ V previously mentioned.

The effects of the input signal falling transition will be considered in light of FIG. 4. When the transition occurs, NFET devices N1 and N5 are first turned off. Meanwhile PFET P5 slowing turns on, thus rising the potential of node C. When the voltage of node C is sufficiently high, the voltage of node E falls through NFET N4 since PFET P4 is not strong enough to maintain it at a high level. When the voltage of node E reaches a certain low point, it turns PFET P3 on, which in turn, pulls node F up towards $V_H$. This cuts PFET P4 off, thereby speeding the fall of the voltage of node E. The increase in potential of node F also turns NFET N2 on, which in turn helps node C to rise through PFET P1. After a small negative undershoot caused by NFET N2 which is on, the potential of node D is held high by PFET P1. The voltage of node G becomes equal to that of node C through PFET P5. At the end of the falling transition, the potential of nodes C, D and F remains at a high, while the potential at node E is at a low.

Receiver circuit 15 has been designed for a CMOS stand-alone Static Random Access Memory (SRAM) chip. Simulation runs, using standard models, have been conducted to compare the performance of receiver circuits of FIGS. 1 and 2 implemented in an advanced CMOS technology. Parasitic drain-substrate and source-substrate capacitances have been added to each FET device. Output terminals were loaded by the same RC structure. Comparison results are detailed below for AC and DC current consumptions as well as the delay between input and output signals. Comparison is extended to the best and worst cases in addition to the nominal case since improvements are sometimes more significant in the former cases then in the latter one.

The following operating conditions, respectively defined as best, nominal, and worst process parameters have been adopted:
Best case:
$V_H=5.5$ Volts—Temp=15° C.
Nominal case:
$V_H=5.0$ Volts—Temp=50° C.
Worst case:
$V_H=4.5$ Volts—Temp=85° C.

1) DC and AC Consumption

In TABLE I, the AC and DC currents, respectively, referred to as $I_{ac}$ and $I_{dc}$ (in mA) for the conventional receiver circuit 10 and the novel receiver circuit 15 of the present invention, are listed. The DC current $I_{dc}$ consumed by the receiver circuits is measured for an input signal at the high level (i.e., $V_{in}=2.2$ V), for the best, nominal and worse cases. The AC current $I_{ac}$ is measured at 40 Mhz for an alternative signal whose amplitude varies between the low level (0.8 V) and the high level (2.2 V) of the TTL standard.

TABLE I

|  | best case | nom case | worst case |
| --- | --- | --- | --- |
| $I_{dc}$ (ma) |  |  |  |
| circuit 10 | 1.85 | 0.97 | 0.46 |
| circuit 15 | 0.29 | 0.09 | 0.005 |
| $I_{ac}$ (ma) |  |  |  |
| circuit 10 | 1.56 | 0.97 | 0.63 |
| circuit 15 | 0.91 | 0.60 | 0.45 |

These values show that under best case conditions, receiver circuit 15 decreases the maximum DC current by a factor of 6. This factor is even more pronounced under nominal worst case conditions. Moreover, circuit 15 also decreases the AC current consumption by 30 to 40%.

When the input signal $V_{in}$ is at a low ($V_{in}=0.8$ V), the DC currents of the two receiver circuits are of the same order of magnitude, i.e., 40 to 80 μA, which is negligible.

2) Delay Variations and Signal Symmetry

TABLE II shows a comparison of delays and signal symmetry between circuit 10 (of FIG. 1) and circuit 15 (of FIG. 2).

Delays are listed for a rising transition (0.8 V to 2.2 V) and a falling transition (2.2 V to 0.8 V) of the input signal $V_{in}$, respectively, referred to as Delay ↑ and Delay ↓. The delay is measured between the input middle swing (1.5 V) and crosspoint of true and complement output signals $V_{out}$ and $\overline{V_{out}}$. To better emphasize the difference between the two receiver circuits, voltages at the crosspoints are given both for rising and fall transitions. These are referred to in TABLE II as V(Xpoint ↑) and V(X point ↓), respectively.

TABLE II

Figure 1:
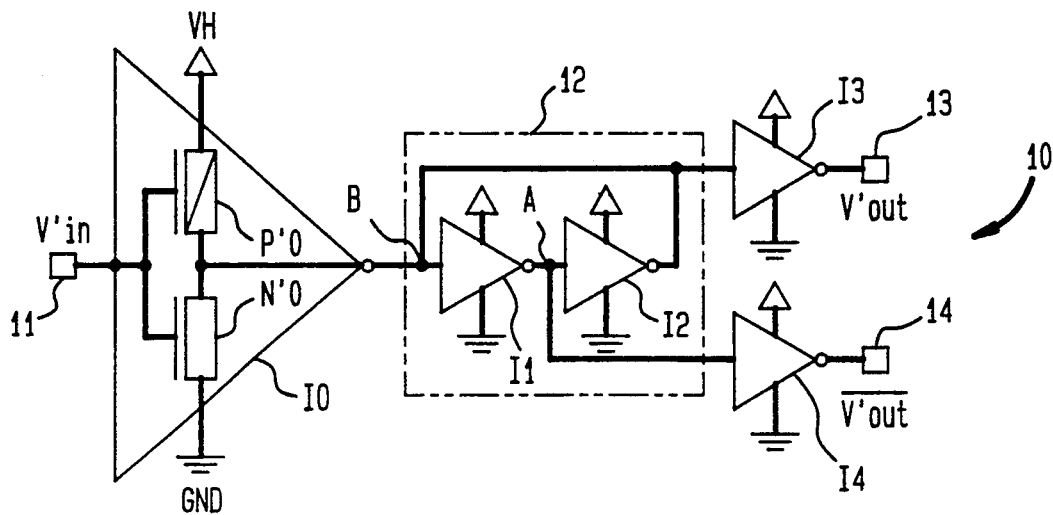
FIG. 1 is a prior art TTL/CMOS receiver circuit which generates true and complement output signals at CMOS levels from an input signal at TTL levels.

|  | best case | nom case | worst case |
| --- | --- | --- | --- |
| Circuit 10 of FIG. 1 |  |  |  |
| Delay ↑ | 2.73 ns | 2.70 ns | 2.81 ns |
| Delay ↓ | 1.61 ns | 2.33 ns | 3.43 ns |
| V(Xpoint ↑) | 4.26 V | 3.82 V | 3.41 V |
| V(Xpoint ↓) | 1.88 V | 1.58 V | 1.37 V |
| Circuit 15 of FIG. 2 |  |  |  |
| Delay ↑ | 2.35 ns | 2.72 ns | 3.27 ns |
| Delay ↓ | 1.58 ns | 2.12 ns | 3.31 ns |
| V(Xpoint ↑) | 1.88 V | 2.02 V | 2.14 V |
| V(Xpoint ↓) | 1.76 V | 2.65 V | 2.82 V |

As apparent from TABLE II, receiver circuit 15 shows less variation of dispersion between rising and fall delays than those of receiver circuit 10. It also shows a reduced variation of delays and a small improvement of the maximum values thereof. By way of example, the maximum delay variation value is about 1.12 ns for receiver circuit 10 to be compared with 0.77 ns of receiver circuit 15 (under best case conditions for both). Finally, as apparent from TABLE II, it also offers highly symmetric output phases, even though the conventional receiver 10 of FIG. 1 has different voltages at the crosspoints caused by mismatches between true and complement output signals. The maximum difference value is 2.36 V for the receiver circuit 10 in the base case conditions, compared with 0.68 V for receiver 15 (in the worst case conditions). High voltage values at crosspoints implies overlapping of output signals that can, for instance, lead to the multiple selection of decoders in a SRAM chip. The values of TABLE II confirm the excellent symmetry of both phases of the output signal irrespective of the type of the transition as illustrated in FIGS. 3 and 4.

3) Hysteresis and DC Noise Margins

Both receiver circuits exhibit similar values for hysteresis (about 500 mV) and DC noise margins (700 mV to 1200 mV depending upon external conditions and input voltage levels). The receiver circuit of FIG. 2 can advantageously replace conventional TTL to CMOS receivers in memory, ASIC or custom chips where low power consumption is of paramount importance. In particular, SRAM chips, which are more and more often used in low power applications, can take advantage of the receiver circuit of FIG. 2 to decrease the overall chip DC current.

What is claimed is:
1. A low cost TTL/CMOS receiver circuit, comprising:
    a first stage, comprising an inverter formed by a first NFET and a first PFET device having a common gate electrode and connected in series to an intermediate NFET coupled in between, thereby defining first and second common nodes;
    a second stage formed by a second NFET and a second PFET device, connected to each other in series and forming a third common node, said second NFET and second PFET devices have gate electrodes which are responsive to voltages, respectively, at said first and second common nodes;
    a third stage, comprising a third PFET connected in series to a third NFET device, forming a fourth common node which is connected to the gate electrode of the intermediate NFET, and wherein
    a gate electrode of said third NFET device is further connected to the gate electrodes of the first NFET and first PFET devices of the first stage via a con- nection that accepts an input signal at an input terminal, said third stage, further comprises a fourth PFET device having a drain connected to the third common node and having a gate electrode connected to the gate electrode of the intermediate NFET device of the first stage, and wherein said third and fourth common nodes, respectively provide true and complementary outputs to the TTL/CMOS circuit; and a fourth stage, comprising a fourth NFET and a fifth PFET device connected to each other in series, said fourth NFET device has a gate electrode connected via a feedback loop to the third common node, and said fifth PFET device has a current electrode connected to the first common node and a gate electrode controlled by said input signal.

2. The low costs TTL/CMOS receiver circuit of claim 1, further comprises inverter buffers respectively connected to said third and fourth common nodes to deliver buffered true and complement output signals at the output terminals.

3. The low cost TTL/CMOS receiver circuit of claim 1, wherein said fourth NFET device is loaded by resistively connected sixth PFET device.

4. The low cost TTL/CMOS receiver circuit of claim 1, wherein said fourth NFET device is loaded by a linearly resistive device.

5. The low cost TTL/CMOS receiver circuit of claim 1, wherein the FET devices are biased between a first and second supply voltage $V_H$ and GND.

6. The low cost TTL/CMOS receiver circuit of claim 1, wherein the signals provided at the true and complement outputs are symmetric with respect to each other at a predetermined crosspoint irrespective of transition types.

* * * * *